United States Patent
Vashchenko et al.

(10) Patent No.: US 6,946,690 B1
(45) Date of Patent: Sep. 20, 2005

(54) HIGH HOLDING VOLTAGE ESD PROTECTION STRUCTURE AND METHOD

(75) Inventors: Vladislav Vashchenko, Palo Alto, CA (US); Ann Concannon, San Jose, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/816,287

(22) Filed: Mar. 21, 2001

(51) Int. Cl.[7] .............................................. H01L 29/74
(52) U.S. Cl. ....................................... 257/133; 257/360
(58) Field of Search ................................. 257/133, 355, 257/360, 139, 147, 173, 141, 175

(56) References Cited

U.S. PATENT DOCUMENTS

| | | | |
|---|---|---|---|
| 6,433,368 B1 * | 8/2002 | Vashchenko et al. | 257/173 |
| 6,509,585 B2 * | 1/2003 | Huang | 257/173 |

* cited by examiner

*Primary Examiner*—Mark V. Prenty
(74) *Attorney, Agent, or Firm*—Jurgen Vollrath

(57) ABSTRACT

The holding voltage (the minimum voltage required for operation) of a LVTSCR-like device is increased to a value that is greater than a dc bias on a to-be-protected node. The holding voltage is increased by reducing the size of the p+ emitter defined by the LVTSCR-like device. As a result, the LVTSCR can be utilized to provide ESD protection to power supply pins, having better current capabilities than a GGN-MOS and better holding voltage characteristics than a LVTSCR.

3 Claims, 3 Drawing Sheets

HIGH HOLDING VOLTAGE ESD PROTECTION STRUCTURE AND METHOD

FIELD OF THE INVENTION

The present invention relates to a high holding voltage ESD protection device, and more particularly, to a device displaying good current capabilities.

BACKGROUND OF THE INVENTION

Analog circuits typically display sensitivity to excessive voltage levels. Transients, such as electrostatic discharges (ESD) can cause the voltage handling capabilities of the analog circuit to be exceeded, resulting in damage to the analog circuit. Clamps have been devised to shunt current to ground during excessive voltage peaks.

One of the difficulties encountered in designing such protection circuitry is that the specifications for these clamps have to fit within a relatively small design window that, on the one hand, must take into account the breakdown voltage of the circuit being protected, and, on the other hand, avoid latch-up under normal operation. Thus, the clamp must be designed such as to be activated below the breakdown voltage of the circuit that is to be protected. At the same time, the latch-up or holding voltage must exceed the normal operating voltage of the protected circuit.

Typical protection clamps employ avalanche diodes such as zener diodes to provide the bias voltage for the base of a subsequent power bipolar junction transistor (BJT).

Grounded gate NMOS devices (GGNMOS) have also been used in the past as ESD protection devices. However, GGNMOS devices are not only large, consuming a lot of space on a chip, they also suffer from the disadvantage that they support only limited current densities. The protection capability of an ESD protection device can be defined as the required contact width of the structure required to protect against an ESD pulse amplitude, or, stated another way, as the maximum protected ESD pulse amplitude for a given contact width. Thus, the smaller the contact width for a given ESD pulse amplitude protection, the better. One possible ESD protection solution is to use a silicon-controlled rectifier (SCR).

A silicon-controlled rectifier (SCR) is a device that provides an open circuit between a first node and a second node when the voltage across the first and second nodes is positive and less than a trigger voltage. When the voltage across the first and second nodes rises to be equal to or greater than the trigger voltage, the SCR provides a low-resistance current path between the first and second nodes. Further, once the low-resistance current path has been provided, the SCR maintains the current path as long as the voltage across the first and second nodes is equal to or greater than a holding voltage that is lower than the trigger voltage. As a result of these characteristics, SCRs have been used to provide ESD protection. When used for ESD protection, the first node becomes a to-be-protected node, and the second node is typically connected to ground. The SCR operates within an ESD protection window that has a maximum voltage defined by the destructive breakdown level of the to-be-protected node, and a minimum voltage (also known as a latch-up voltage) defined by any dc bias on the to-be-protected node.

Thus, when the voltage across the to-be-protected node and the second node is less than the trigger voltage, the SCR provides an open circuit between the to-be-protected node and the second node. However, when the to-be-protected node receives a voltage spike that equals or exceeds the trigger voltage, such as when an ungrounded human-body contact occurs, the SCR provides a low-resistance current path from the to-be-protected node to the second node. In addition, once the ESD event has passed and the voltage on the to-be-protected node falls below the holding voltage, the SCR again provides an open circuit between the to-be-protected node and the second node.

FIG. 1 shows a cross-sectional view that illustrates a conventional SCR 100. As shown in FIG. 1, SCR 100 has a n-well 112 which is formed in a p-type semiconductor material 110, such as a substrate or a well, and a n+ region 114 and a p+ region 116 which are formed in n-well 112. The n+ and p+ regions 114 and 116 are both connected to a to-be-protected node 120. As further shown in FIG. 1, SCR 100 also has a n+ region 122 and a p+ region 124 formed in semiconductor material 110. The n+ and p+ regions 122 and 124 are both connected to an output node 126.

In operation, when the voltage across nodes 120 and 126 is positive and less than the trigger voltage, the voltage reverse biases the junction between n-well 112 and p-type material 110. The reverse-biased junction, in turn, blocks charge carriers from flowing from node 120 to node 126. However, when the voltage across nodes 120 and 126 is positive and equal to or greater than the trigger voltage, the reverse-biased junction breaks down due to avalanche multiplication.

The breakdown of the junction causes a large number of holes to be injected into material 110, and a large number of electrons to be injected into n-well 112. The increased number of holes increases the potential of material 110 in the region that lies adjacent to n+ region 122, and eventually forward biases the junction between material 110 and n+ region 122.

When the increased potential forward biases the junction, a npn transistor that utilizes n+ region 122 as the emitter, p-type material 110 as the base, and n-well 112 as the collector turns on. When turned on, n+ (emitter) region 122 injects electrons into (base) material 110. Most of the injected electrons diffuse through (base) material 110 and are swept from (base) material 110 into (collector) n-well 112 by the electric field that extends across the reverse-biased junction. The electrons in (collector) n-well 112 are then collected by n+ region 114.

A small number of the electrons injected into (base) material 110 recombine with holes in (base) material 110 and are lost. The holes lost to recombination with the injected electrons are replaced by holes injected into (base) material 110 by the broken-down reverse-biased junction and, as described below, by the collector current of a pnp transistor, thereby providing the base current.

The electrons that are injected and swept into n-well 112 also decrease the potential of n-well 112 in the region that lies adjacent to p+ region 116, and eventually forward bias the junction between p+ region 116 and n-well 112. When the decreased potential forward biases the junction between p+ region 116 and n-well 112, a pnp transistor formed from p+ region 116, n-well 112, and material 110, turns on.

When turned on, p+ emitter 116 injects holes into base 112. Most of the injected holes diffuse through (base) n-well 112 and are swept from (base) n-well 112 into (collector) material 110 by the electric field that extends across the reverse-biased junction. The holes in (collector) material 110 are then collected by p+ region 124.

A small number of the holes injected into (base) n-well 112 recombine with electrons in (base) n-well 112 and are lost. The electrons lost to recombination with the injected holes are replaced by electrons flowing into n-well 112 as a result of the broken-down reverse-biased junction, and n-well 112 being the collector of the npn transistor. Thus, a small part of the npn collector current forms the base current of the pnp transistor.

Similarly, as noted above, the holes swept into (collector) material 110 also provide the base current holes necessary to compensate for the holes lost to recombination with the diffusing electrons injected by n+ (emitter) region 122. Thus, a small part of the pnp collector current forms the base current of the npn transistor.

Thus, n+ region 122 injects electrons that provide both the electrons for the collector current of the npn transistor as well as the electrons for the base current of the pnp transistor. At the same time, p+ region 116 injects holes that provide both the holes for the collector current of the pnp transistor as well as the holes for the base current of the npn transistor.

One of the advantages of SCR 100 over other ESD protection devices, such as a grounded-gate MOS transistor, is the double injection provided by n+ region 122 and p+ region 116 of SCR 100. With double injection, SCR 100 provides current densities (after snapback) that are about ten times greater than the densities provided by a grounded-gate MOS device.

One of the disadvantages of SCR 100, however, is that a very large positive voltage, e.g., 50 volts, must be dropped across nodes 120 and 126 before the junction between p-type material 110 and n-well 112 breaks down. As a result, SCR 100 can not be used to protect devices, such as MOS transistors, that can be permanently damaged by much lower voltages, e.g., 15 volts.

One solution proposed in the past, was to use low voltage silicon controlled rectifiers (LVTSCRs) which are not only smaller but allow the reaching of current densities, after snap back, that are some ten times higher than the current densities of traditionally used grounded gate NMOS devices (GGNMOS), thus increasing the ESD protection capability for CMOS circuits.

An LVTSCR incorporates a NMOS transistor into SCR 100. FIG. 2 shows a cross-sectional diagram that illustrates a conventional LVTSCR 200. LVTSCR 200 and SCR 100 are similar and, as a result, utilize the same reference numerals to designate the structures that are common to both devices.

As shown in FIG. 2, LVTSCR 200 differs from SCR 100 in that LVTSCR 200 has a n+(drain) region 230 that is formed in both material 110 and n-well 112, and a channel region 232 that is defined between n+ (source) region 122 and n+ (drain) region 230. In addition, LVTSCR 200 includes a gate oxide layer 234 that is formed on material 110 over channel region 232, and a gate 236 that is formed on gate oxide layer 234. N+ (source and drain) regions 122 and 230, gate oxide layer 234, and gate 236 define a NMOS transistor 238 which is typically formed to be identical to the to-be-protected MOS transistors in the circuit.

In operation, when the voltage on the drain of a conventional NMOS transistor spikes up, the drain-to-substrate junction of the NMOS transistor breaks down, for example, at 7 volts, while the gate oxide layer that isolates the gate from the drain destructively breaks down at, for example, 10–15 volts.

Since NMOS transistor 238 is formed to be identical to the to-be-protected MOS transistors, the junction between n+ region 230 and material 110 breaks down at the same time that the to-be-protected MOS transistors experience junction break down as a result of an ESD pulse. Once the reverse-biased junction between region 230 and material 110 breaks down, the break down triggers LVTSCR 200 to operate the same as SCR 100.

Since junction break down occurs before the MOS transistors experience destructive gate oxide break down, LVTSCR 200 turns on before destructive gate oxide breakdown occurs, thereby protecting the MOS transistors. Thus, the junction break down voltage, which is less than the voltage level that causes destructive gate oxide break down, functions as the trigger voltage. In addition, other techniques, such as reducing the width of channel region 232, can be used to lower the trigger voltage so that the region 230 to material 110 junction breaks down before the to-be-protected MOS transistors experience junction break down.

Thus, LVTSCR 200 provides a SCR with a significantly lower turn-on voltage that allows MOS transistors to be protected from ESD events with an SCR. However, one disadvantage of LVTSCR 200, and, for that matter, any SCR is that it suffers from a holding voltage that is often less than the minimum (or latch-up) voltage of the ESD protection window. The low holding voltage of the LVTSCR which lies in the range of less than two volts, is due to the double junction injection of its conductivity modulation mechanism. While the p+ emitter allows one to define how many holes are injected, the injection of the holes leads to greater space charge neutralization and thus a lower holding voltage. As a result, standard LVTSCRs are >unattractive candidates for providing ESD protection to power supply pins.

As mentioned above, the major requirement when designing ESD protection circuits, is that the circuit operate within a so-called "ESD protection window" that is usually limited by both the maximum voltage in the protected line (which is related to the breakdown of the protected circuits) and the latch-up voltage when the DC bias is presented in the protected line. In the LVTSCR, when the minimum (or latch-up) voltage of the ESD protection window is equal to a dc bias, such as the power supply voltage, LVTSCR 200 can not turn off (thus latching up) after the ESD event has passed. Thus, power must be cycled after the ESD event.

For example, assume that node 120 is a power supply pin at 3.3 volts, node 126 is a ground pin, the junction breakdown voltages of the to-be-protected MOS transistors are 7.0 volts, and the holding voltage is 1.8 volts. In this example, LVTSCR 200 is turned off under normal operating conditions when the voltage on node 120 is 3.3 volts. When the voltage on node 120 spikes up to a value equal to or greater than the trigger voltage (7 volts in this example), LVTSCR 200 turns on, thereby protecting the MOS devices that receive power from node 120. However, once the ESD event has passed, since the normal operating voltage on node 120 is 3.3 volts, and it takes only 1.8 volts on node 120 to keep LVTSCR 200 in this example turned on, LVTSCR 200 remains turned on (latched up) after the ESD event has passed.

Thus, in spite of higher current availability from an LVTSCR after snap back, conventional CMOS integrated circuits are usually protected by grounded gate NMOS snap back structures (GGNMOS) due to the latch-up limitations of LVTSCRs.

What is needed is a device that fills the void between low current GGNMOS devices and low holding voltage, high current SCR and LVTSCR devices.

SUMMARY OF THE INVENTION

The present invention provides an ESD protection structure with a high holding voltage suitable, among other things, for CMOS I/O and power supply protection. In particular, it provides a low-voltage triggering silicon-controlled rectifier-like (LVTSCR-like) device that increases the value of the holding voltage by reducing the size of the p+ emitter of the device. The invention also provides for a high holding voltage device that supports high current densities by keeping the p+ below a certain size and increasing n+ emitter to limit space charge neutralization, and a method of manufacturing such a device.

A device in accordance with the present invention is formed in a semiconductor material of a first conductivity type, and includes a well of a second conductivity type that is formed in the semiconductor material. The device also includes a first region of the second conductivity type that is formed in the well, and a second region of the first conductivity type that is formed in the well. The first and second regions are connected to a first node.

The device further includes a third region of the second conductivity type that is formed in the semiconductor material, and a fourth region of the first conductivity type that is formed in the semiconductor material. The third and fourth regions are connected to a second node.

The device may additionally include a fifth region of the second conductivity type that is formed in the semiconductor material and the well.

Preferably the first conductivity type material is p material. In accordance with the invention, the second region, which defines a p+ emitter of a pnp transistor is decreased in size. The third region, which defines a n+ emitter of a npn transistor, may be increased in size.

Further, according to the invention, there is provided a LVTSCR-like device having a reduced p+ emitter region. The reduced p+ emitter region reduces the number of holes for space charge neutralization. Thus, it reduces the total emitter injection current and provides only partial injected space charged neutralization. The uncompensated space charge effects the electric field distribution in the device which causes a higher voltage drop. Although the modified structure reduces the current density that the device will support, the maximum current after triggering of the proposed structure is, nevertheless, 3–5 times more than in the case of traditional GGNMOS.

Still, further, according to the invention, there is provided a method for providing a device with snapback holding voltage characteristics equivalent to that of GGNMOS, but having higher current capabilities which may be two to three times higher than for GGNMOS. The method includes using a SCR-like structure or LVTSCR-like structure and adjusting the dimensions of one or more features in the structure to limit space charge neutralization, thereby to increase holding voltage to the desired level. Typically the size of the p+ emitter is reduced in size. The n+ emitter may also be increased in addition to decreasing the p+ emitter.

Still further, according to the invention, there is provided a method of providing a device having a higher holding voltage than an LVTSCR and supporting a higher current than a GGNMOS, comprising providing a LVTSCR-like structure having a p+ emitter that is sufficiently reduced in size so as to limit hole injection to the point where the space charge neutralization is so limited as to increase the holding voltage to the desired level.

DETAILED DESCRIPTION OF THE INVENTION

In order to achieve a structure having improved holding voltage characteristics than a LVTSCR and improved current density than a GGNMOS the present invention proposes using a device having the features of a SCR or LVTSCR, but wherein the dimensions of the features are changed over that of a standard LVTSCR, to achieve reduced space charge neutralization.

Figure 1:
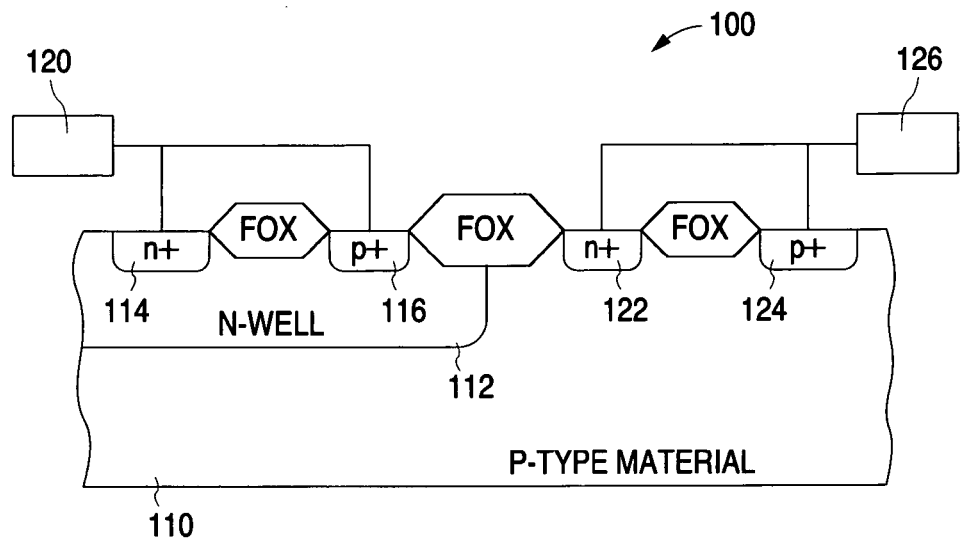
FIG. 1 is a cross-sectional view illustrating a conventional SCR 100.
Figure 2:
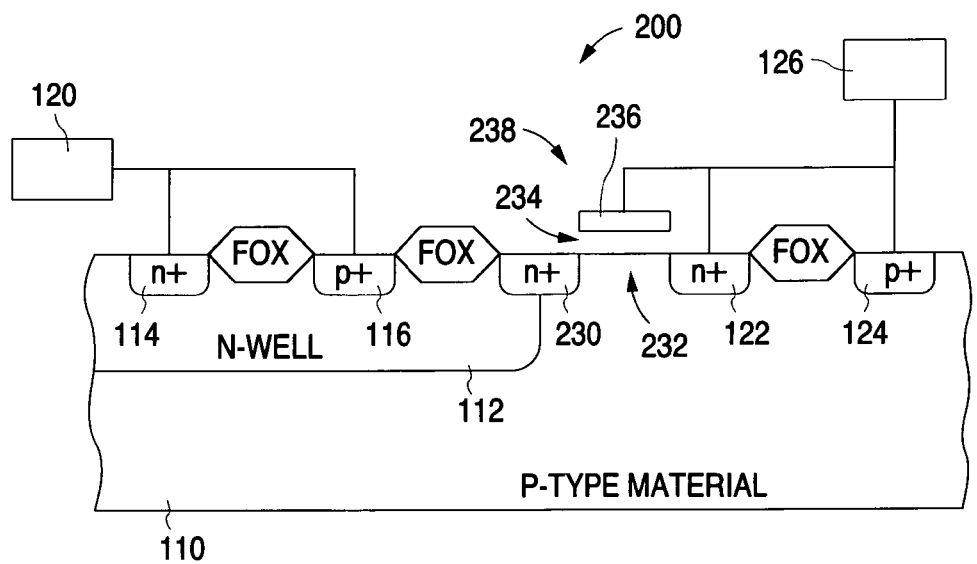
FIG. 2 is a cross-sectional view illustrating a conventional LVTSCR 200.
Figure 3:
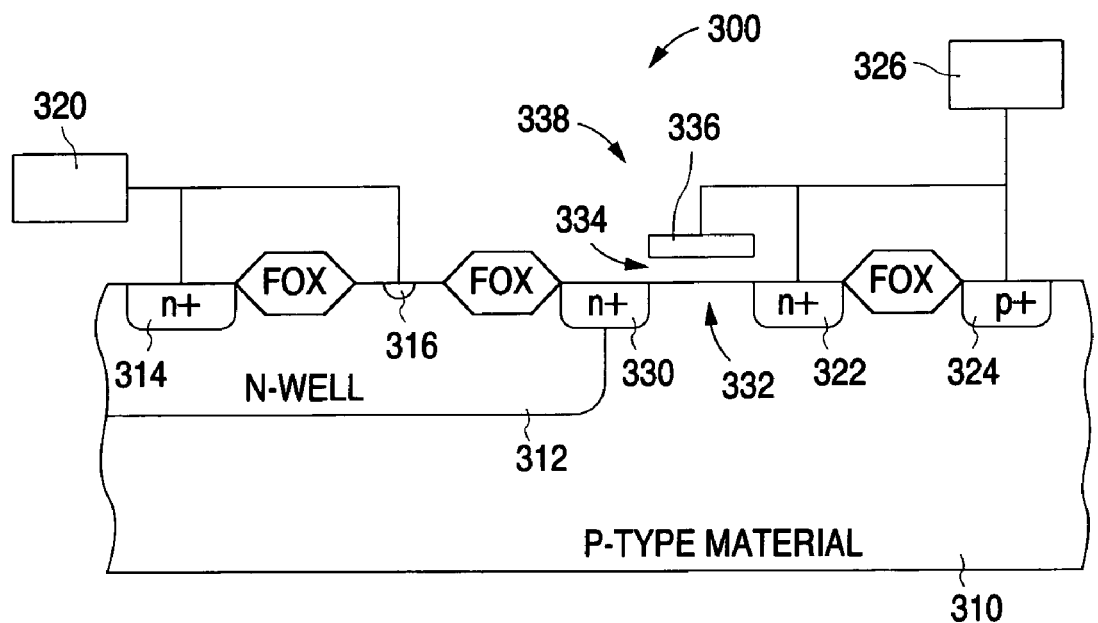
FIG. 3 is a cross-sectional view illustrating a device in accordance with the present invention.

FIG. 3 shows a cross-sectional view that illustrates on embodiment of a LVTSCR-like device 300 in accordance with the present invention. As described in greater detail below, the holding voltage of the device 300 is increased by reducing the space charge neutralization, which is achieved by limiting the number of holes injected into the device. This, in turn, is achieved by reducing the p+ emitter junction area defined by the device 300. As shown in FIG. 3, the p+emitter of the pnp transistor of device 300 is reduced in size as compared to the conventional p+emitter 116 shown in FIG. 2.

As shown in FIG. 3, device 300 has a n-well 312 which is formed in a p-type semiconductor material 310, such as a substrate or a well, and a n+ region 314 and a p+ region 316 which are formed in n-well 312. The p+ region 316 and the n+ region 314 are connected to a first node 320. As further shown in FIG. 3, device 300 also has a n+ region 322 and a p+region 324 which are formed in semiconductor material 310. The n+ region 322 and the p+region 324, are both connected to a second node 326.

In addition, device 300 has a n+ (drain) region 330 that is formed in material 310 and in n-well 312. A channel region 332 that is defined between n+ (source) region 322 and n+ (drain) region 330. In addition, device 300 includes a gate oxide layer 334 that is formed on material 310 over channel region 332, and a gate 336 that is formed on gate oxide layer 334. The n+(source and drain) regions 322 and 330, gate oxide layer 334, and gate 336 define a NMOS transistor 338 which is typically formed to be identical to the to-be-protected MOS transistors in the circuit. In a preferred embodiment, n+ emitter 322 is increased in size to further reduce space charge neutralization. However, increasing n+ emitter 322 only has a beneficial effect if p+ emitter is reduced to below a critical size, as can be determined using simulation techniques such as TCAD analysis.

Further, gate 336 is either directly connected to a ground node, or connected to the ground node via a resistive element. When node 326 is a ground node, gate 336 can be connected to node 326. Gate oxide layer 334 and gate 336 are optional elements of device 300, but are conventionally used because of manufacturing and other considerations. (Gate 336, for example, self aligns the implants that form the n+ regions 322 and 330.)

In accordance with the present invention, the p+ emitter 316 has been reduced in size to limit the injection of holes, as is discussed in greater detail below.

Figure 4:
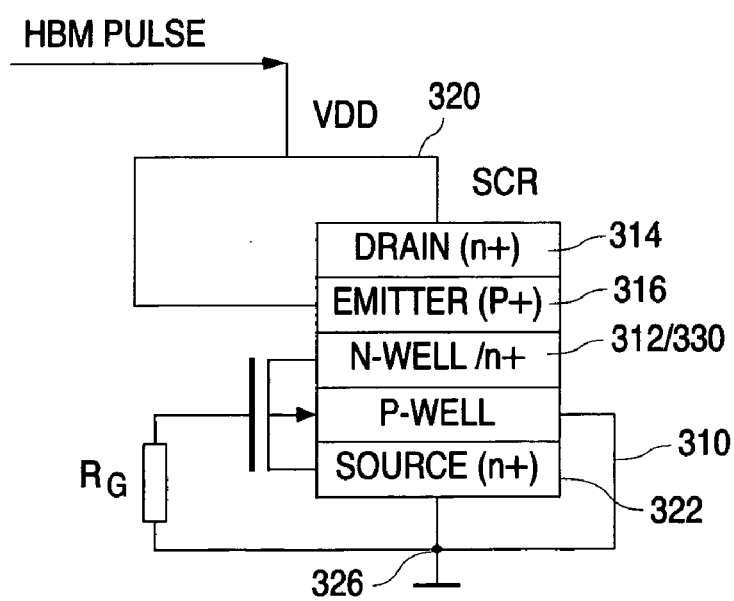
FIG. 4 shows an implementation of a device of the invention in a simulated ESD scenario.

A implementation of the device 300 as an ESD protection device, to obtain performance characteristics using a human body model (HBM) pulse as shown in FIG. 4. The device 300 shows the n+ regions 314, 312, 330, constituting the drain, and p+ region 316 (p+ emitter) connected to the first node 320 which, in this case, is connected to VDD. The p+ region 324 (p-well) and n+ region 322 (source) are connected to the second node, which, in this case, is connected to ground. The gate 336 is connected to the second node 326 via a resistor 400.

In the operation of device 300, when a voltage across nodes 320 and 326 is positive and less than the trigger voltage, the voltage reverse biases the junction between n+ (drain) and p-type material 310. The reverse-biased junction, in turn, blocks current from flowing from node 320 to node 326. On the other hand, when the voltage across nodes 320 and 326 is equal to or greater than the trigger voltage, the reverse-biased junction breaks down due to avalanche multiplication.

The breakdown of the junction causes a large number of holes to be injected into material 310, and a large number of electrons to be injected into n-well 312. The increased number of holes increases the potential of material 310 in the region that lies adjacent to n+ region 322, and eventually forward biases the junction between material 310 and n+ region 322. When the increased potential forward biases the junction between material 310 and n+ region 322, a npn transistor formed from n+ region 322, p-type material 310, and n-well 312 turns on.

When the npn transistor turns on, n+ region 322 injects electrons into material 310. Most of the injected electrons diffuse through (base) material 310 and are swept from (base) material 310 into (collector) n-well 312 by the electric field that extends across the reverse-biased junction. The electrons in (collector) n-well 312 are then collected by n+ region 314.

A small number of the electrons injected into (base) material 310 recombine with holes in (base) material 310 and are lost. The holes lost to recombination with the injected electrons are replaced by holes injected into (base) material 310 by the broken-down reverse-biased junction and, as described below, by the collector current of a pnp transistor, thereby providing the base current.

The electrons that are injected and swept into n-well 312 also decrease the potential of n-well 312 in the region that lies adjacent to p+ region 316, and eventually forward bias the junction between p+ region 316 and n-well 312. When the decreased potential forward biases the junction between p+ region 316 and n-well 312, a pnp transistor formed from p+ region 316, n-well 312, and p-type material 310 turns on.

When turned on, p+ emitter 316 injects holes into (base) n-well 312. Most of the injected holes diffuse through (base) n-well 312 and are swept from (base) n-well 312 into (collector) material 310 by the electric field that extends across the reverse-biased junction. The holes in (collector) material 310 are then collected by p+ region 324.

A small number of the holes injected into (base) n-well 312 recombine with electrons in (base) n-well 312 and are lost. The electrons lost to recombination with the injected holes are replaced by electrons flowing into n-well 312 as a result of the broken-down reverse-biased junction, and n-well 312 being the collector of the npn transistor. Thus, a small part of the npn collector current forms the base current of the pnp transistor.

Similarly, as noted above, the holes swept into (collector) material 310 also provide the base current holes necessary to compensate for the holes lost to recombination with the diffusing electrons injected by n+ (emitter) region 322. As a result, a small part of the pnp collector current forms the base current of the npn transistor.

Thus, n+ region 322 injects electrons that provide both the electrons for the collector current of the npn transistor as well as the electrons for the base current of the pnp transistor. At the same time, p+ region 316 injects holes that provide both the holes for the collector current of the pnp transistor as well as the holes for the base current of the npn transistor.

Reducing the number of holes injected into n-well 312 reduces the number of holes that are swept into material 310. Since the holes that are swept into material 310 form both the pnp collector current and the npn base current, a reduced pnp collector current means a reduced npn base current. Reducing the npn base current, in turn, reduces the number of electrons that are injected into material 310 from n+ (npn emitter) region 322. Thus, when the number of holes flowing into material 310 decreases, relative to the electrons injected into material 310 from n+region 322 the space change is neutralized to a lesser extent thereby increasing the holding voltage of device 300. Thus, by properly sizing the p-emitter 316, the magnitude of the holding voltage of device 300 can be increased above a dc bias that is present on the to-be-protected node. As a result, device 300 turns off following an ESD event. In another embodiment, the p+emitter is reduced in size to below a critical size, and the space charge neutrality adjusted by appropriately increasing the n+ emitter.

Figure 5:
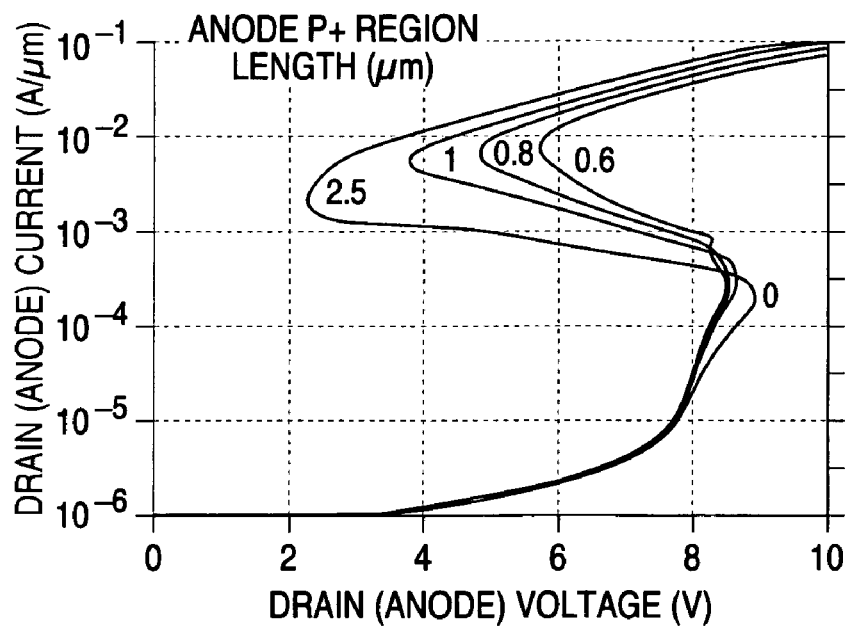
FIG. 5 is a set of current-voltage graphs of the invention for different sizes of the p+emitter.
Figure 6:
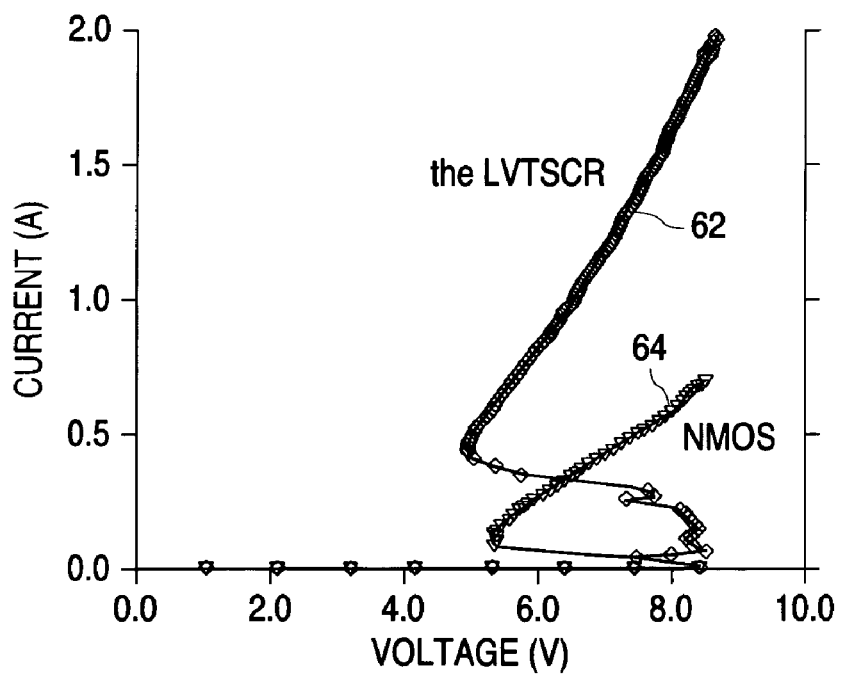
FIG. 6 shows current-voltage graphs showing the characteristics of a device in accordance with the invention, compared to that of a GGNMOS device.

FIG. 5 shows a graphical representation that illustrates the V-I characteristics of the device of the present invention for various sizes of the p+ region 316. The evaluation was for a human-body model (HBM) ESD pulse using a thermally-coupled mixed-mode device simulation.) As shown in FIG. 5, decreasing the p+ emitter increases the holding voltage of the device after snapback. Thus, one advantage of the invention is that it provides an ESD protection device, the current density and holding voltage characteristics of which can be selected to lie anywhere between those offered by GGNMOS and regular LVTSCR devices. In fact, as shown in FIG. 6, one embodiment of the device of the invention, which used a n-well 312 depth of 1.2 $\mu$m, a p+ emitter depth of 1 $\mu$m, and a n+ region 314 depth of 2.5 $\mu$m delivered three times higher current in the on-state (graph 62) than a GGNMOS device (graph 64). Thus, the device of the invention provides an ESD protection solution which either allows a significant decrease in physical size of the device over a GGNMOS or protects against at least three times higher ESD pulse amplitudes for a given contact width while providing essentially the same holding voltage.

It should be understood that various alternatives to the embodiments of the invention described herein may be employed in practicing the invention to achieve varying amounts of holes being injected compared to electrons. It will also be appreciated that the structure can be formed with opposite polarity elements so that, instead of holes, the minority carriers are electrons. In such an embodiment, the n+ emitter formed in a p+ well would be reduced in size to limit the injection of the electrons relative to holes. Thus, it is intended that the following claims define the scope of the invention and that methods and structures within the scope of these claims and their equivalents be covered thereby.

What is claimed is:

1. A method of manufacturing a device having an elevated holding voltage, and formed in a semiconductor material of a first conductivity type, the semiconductor material having a dopant concentration, the device comprising a well of a second conductivity type formed in the semiconductor material, the well having a dopant concentration;

a first region of the second conductivity type formed in the well, the first region having a dopant concentration greater than the dopant concentration of the well, the first region being connected to a first node;

a second region of the first conductivity type formed in the well, the second region having a dopant concentration greater than the dopant concentration of the semiconductor material, the second region being connected to the first node;

a third region of the second conductivity type formed in the semiconductor material, the third region having a dopant concentration greater than the dopant concentration of the well, the third region being connected to a second node; and a fourth region of the first conductivity type formed in the semiconductor material, the fourth region having a dopant concentration greater than the dopant concentration of the semiconductor material, and being connected to the second node, the method comprising;

adjusting the size of the second region to limit injection of minority carriers to achieve the desired elevated holding voltage.

2. The method of claim 1, wherein the first conductivity type is p type and the second conductivity type is n type.

3. The method of claim 2, wherein, in addition to adjusting the size of the second region, adjusting the size of the third region to increase electron injection to a point where space charge neutralization is sufficiently limited to achieve the desired elevated holding voltage.

* * * * *